(12) United States Patent
Norrell et al.

(10) Patent No.: US 6,947,529 B2
(45) Date of Patent: Sep. 20, 2005

(54) DSL COMPATIBLE LOAD COIL

(75) Inventors: Andrew L. Norrell, Nevada City, CA (US); James Schley-May, Nevada City, CA (US)

(73) Assignee: 2wire, Inc., San Jose, CA (US)

( * ) Notice: Subject to any disclaimer, the term of this patent is extended or adjusted under 35 U.S.C. 154(b) by 0 days.

(21) Appl. No.: 09/819,158

(22) Filed: Mar. 27, 2001

(65) Prior Publication Data

US 2002/0141569 A1 Oct. 3, 2002

Related U.S. Application Data

(60) Provisional application No. 60/262,492, filed on Jan. 17, 2001.

(51) Int. Cl.$^7$ ............................................. H01F 17/08
(52) U.S. Cl. ................... 379/93.01; 379/93.09; 379/398; 178/46
(58) Field of Search ..................... 178/45, 46; 370/480; 379/398, 93.01, 93.09

(56) References Cited

U.S. PATENT DOCUMENTS

| | | | | | |
|---|---|---|---|---|---|
| 761,995 | A | * | 6/1904 | Pupin | 178/45 |
| 1,711,653 | A | * | 5/1929 | Quarles | 178/45 |
| 3,476,883 | A | * | 11/1969 | Birck | 178/46 |

(Continued)

OTHER PUBLICATIONS

Rhombus Industries, Testing Inter–Winding Capacitance, 1997.*
Delta Products Corporation, Transformer General Parameters.*
Baker, Todd, The Challenges of Implementing, Oct. 1998, Tektronix, p. 2.*
Vittore, Vince, Making DSL Go For the Long Run, Telephony Magazine, Dec. 11, 2000, paragraph 11.*
Reference Data for Radio Engineers, Federal Telephone and Radio Company, Aug. 1944, p. 111.*
Vittone, V. Making DSL Go for the Long Run, Telephony, Dec. 11, 2000, paragraphs 10–11.
"Design Idea DI–61 TinySwitch®–II 3 W Charger: <200 MW No–load Consumption", Power® Integrations, www.powerint.com, Mar. 2004, pp. 2 total.
Data Sheet, "Lundahl Transformers, Tube amplifier transformers", http://www.lundahl.se/tubes.html, Apr. 13, 2004, pp. 1–7.
"TechWeb" TechEncyclopedia, http://www.techweb.com/encyclopedia, Apr. 16, 2004, pp. 1–4.
Nathan R. Grossner, "The Wide–Band Transformer: Synthesis", and "The Pulse Transformer: Analysis", Transformers for Electronic Circuits, Copyright © 1967, by McGraw–Hill, pp. 225–252.
"Smart Coil TM–The line conditioner for the digital age? Smart Coils condition copper pairs for deployment of both ADSL (data) and toll–quality voice services on the same line", Charles a registered Trademark of Charles Industries, LTD., pp. 2.

*Primary Examiner*—Sinh Tran
*Assistant Examiner*—Daniel Swerdlow
(74) *Attorney, Agent, or Firm*—Blakely, Sokoloff, Taylor & Zafman LLP

(57) ABSTRACT

A load coil is disposed along a local loop for conditioning POTS signals while permitting passage of higher frequency DSL signals with low attenuation. In one embodiment, the load coil includes a coupled inductor having multiple capacitive elements coupled thereto, the capacitive elements facilitating passage of the DSL signals across the load coil.

12 Claims, 5 Drawing Sheets

U.S. PATENT DOCUMENTS

| | | | | |
|---|---|---|---|---|
| 3,578,914 | A | 5/1971 | Simonelli | |
| 3,848,098 | A * | 11/1974 | Pinel | 379/402 |
| 4,259,642 | A | 3/1981 | Derby | |
| 4,277,655 | A | 7/1981 | Surprenant | |
| 4,768,188 | A | 8/1988 | Barnhart et al. | |
| 4,788,657 | A | 11/1988 | Douglas et al. | |
| 4,970,722 | A | 11/1990 | Preschutti | |
| 5,049,832 | A | 9/1991 | Cavers | |
| 5,095,528 | A | 3/1992 | Leslie et al. | |
| 5,623,485 | A | 4/1997 | Bi | |
| 5,724,344 | A | 3/1998 | Beck | |
| 5,736,949 | A | 4/1998 | Ong et al. | |
| 5,790,174 | A | 8/1998 | Richard, III et al. | |
| 5,859,895 | A | 1/1999 | Pomp et al. | |
| 5,892,756 | A | 4/1999 | Murphy | |
| 5,909,445 | A | 6/1999 | Schneider | |
| 5,912,895 | A | 6/1999 | Terry et al. | |
| 5,929,402 | A | 7/1999 | Charles et al. | |
| 5,991,311 | A | 11/1999 | Long et al. | |
| 6,005,873 | A | 12/1999 | Amit | |
| 6,029,048 | A | 2/2000 | Treatch | |
| 6,047,222 | A | 4/2000 | Burns et al. | |
| 6,058,162 | A | 5/2000 | Nelson et al. | |
| 6,084,931 | A | 7/2000 | Powell, II et al. | |
| 6,091,713 | A | 7/2000 | Lechleider et al. | |
| 6,091,722 | A | 7/2000 | Russell et al. | |
| 6,128,300 | A | 10/2000 | Horton | |
| 6,154,524 | A | 11/2000 | Bremer | |
| 6,188,669 | B1 | 2/2001 | Bellenger | |
| 6,195,414 | B1 | 2/2001 | Simmons et al. | |
| 6,208,670 | B1 | 3/2001 | Milliron et al. | |
| 6,226,322 | B1 | 5/2001 | Mukherjee | |
| 6,236,664 | B1 | 5/2001 | Erreygers | |
| 6,236,714 | B1 | 5/2001 | Zheng et al. | |
| 6,246,695 | B1 | 6/2001 | Seazholtz et al. | |
| 6,262,972 | B1 | 7/2001 | McGinn et al. | |
| 6,263,047 | B1 | 7/2001 | Randle et al. | |
| 6,266,348 | B1 | 7/2001 | Gross et al. | |
| 6,266,395 | B1 | 7/2001 | Liu et al. | |
| 6,281,454 | B1 | 8/2001 | Charles et al. | |
| 6,343,114 | B1 | 1/2002 | Chea, Jr. | |
| 6,345,071 | B1 | 2/2002 | Hamdi | |
| 6,345,072 | B1 | 2/2002 | Liu et al. | |
| 6,351,493 | B1 | 2/2002 | Reed et al. | |
| 6,370,188 | B1 | 4/2002 | Wu et al. | |
| 6,385,234 | B1 | 5/2002 | Ashley | |
| 6,385,252 | B1 | 5/2002 | Gradl | |
| 6,385,253 | B1 | 5/2002 | Swisher | |
| 6,507,606 | B2 * | 1/2003 | Shenoi et al. | 375/211 |
| 6,546,100 | B1 * | 4/2003 | Drew | 379/415 |
| 2002/0001340 | A1 | 1/2002 | Shenoi et al. | |
| 2002/0106076 | A1 | 8/2002 | Norrell et al. | |
| 2002/0113649 | A1 * | 8/2002 | Tambe et al. | 330/250 |

* cited by examiner

DSL COMPATIBLE LOAD COIL

CROSS REFERENCE TO RELATED APPLICATIONS

This application is related to and claims priority of U.S. Provisional Patent Application No. 60/262,492 entitled "DSL Compatible Load Coil" filed Jan. 17, 2001 by Andrew Norrell and James Schley-May, the disclosure of which is hereby incorporated by reference. This application also relates to commonly assigned U.S. patent application Ser. No. 09/569,470 entitled "DSL Repeater" filed May 12, 2000 by Brian Hinman, Andrew Norrell and James Schley-May, and to U.S. patent application Ser. No. 09/670,475 entitled "Load Coil and DSL Repeater Including Same" filed on Sep. 26, 2000 by Brian Hinman, Andrew Norrell, Carl Alelyunas, and James Schley-May the disclosures of which are also hereby incorporated by reference.

BACKGROUND

1. Technical Field

The present system and method generally relate to load coils, and more particularly to an xDSL (Digital Subscriber Line) compatible load coil for conditioning POTS (Plain Old Telephone Service)-band signals while permitting xDSL signals to traverse the load coil with low attenuation.

2. Description of Background Art

Load coils, also referred to as "loading coils," are conventionally positioned along long local loops to improve POTS, or voice-grade, communications over the loop. Conventional load coils are inductive devices that are positioned along a local loop to compensate for, or counteract, the distributed parallel capacitance of the local loop. Such use of load coils generally conditions long local loops for POTS-band communications by flattening out the POTS band up to about 3.6 KHz. These load coils, however, also significantly limit, or prevent, the provision of digital services over a loaded loop due to the attenuation conventional load coils impart to higher frequency signals, such as ADSL (Asymmetric DSL) signals.

ADSL signals, for example, typically reside between about 26 KHz–1.1 MHz and are highly attenuated by conventional load coils. Indeed, in the past, load coils are routinely removed from local loops in order to provide ADSL service over such loops. The removal of such load coils, in turn, impairs or prevents the provision of POTS service over long loops, such as over loops longer than about 18,000 feet.

A need exists, therefore for an improved load coil that compensates for the distributed parallel capacitance of a local loop while permitting passage of higher frequency digital signals.

Additional background details regarding DSL technology more generally are described in *Understanding Digitial Subscriber Line Technology* by Starr, Cioffi, and Silverman, Prentice Hall 1999, ISBN 0137805454 and in *DSL— Simulation Techniques and Standards Development for Digital Subscriber Line Systems* by Walter Y. Chen, Macmillan Technical Publishing, ISBN 1578700175, the disclosures of which are hereby incorporated by reference.

SUMMARY

A passive load coil for disposal along a local loop for improving transmission of POTS-band signals and primarily low attenuation passage of higher frequency signals across the loop includes inductive elements for conditioning the loop to improve transmission of POTS-band signals and capacitive elements for facilitating passage of the higher frequency signals, such as xDSL signals, over the local loop. The load coil improves POTS performance and passes signals above the POTS band, such as xDSL signals, with significantly less attenuation than conventional load coils.

In one embodiment, the load coil includes a coupled inductor having an inter-winding capacitance and capacitive elements for significantly increasing the effective inter-winding capacitance of the coupled inductor. Pursuant to one particular embodiment, the capacitive elements may comprise a pair of capacitors each having a capacitance in the range of about 5 nF–82 nF, and preferably a value of about 39 nF. One capacitor is disposed between the input of a first inductor winding and the input of the second inductor winding; the other capacitor is disposed between the output of the second inductor winding and the output of the first inductor to increase the effective inter-winding capacitance of the coupled inductor for improving high frequency signal transmission across the load coil.

In another embodiment, the load coil includes a coupled inductor having an intra-winding capacitance and capacitive elements for increasing the effective intra-winding capacitance of the coupled inductor. Pursuant to one particular embodiment, the capacitive elements may comprise a pair of capacitors each having a capacitance in the range of about 5 nF–82 nF, and preferably a value of about 39 nF. Each capacitor is positioned in parallel with one of the windings of the coupled inductor to increase the effective intra-winding capacitance of the coupled inductor for improving high frequency signal transmission across the load coil.

According to another embodiment, a system for transmitting POTS and xDSL signals over a local loop includes an xDSL repeater and a load coil positioned in cascaded fashion along the local loop. The load coil includes inductive elements for conditioning the loop to improve POTS-band transmissions and capacitive elements to permit xDSL signals to traverse the load coil with low attenuation. The load coil included within the repeater may be configured differently from the load coil disposed in cascaded fashion with the repeater. The repeater amplifies the xDSL signals to compensate for the attenuation of the xDSL signals as they traverse the loop.

Additional details and features of the present system and method will be apparent to those skilled in the art from the following detailed description and the accompanying drawings.

BRIEF DESCRIPTION

DETAILED DESCRIPTION OF THE DRAWINGS

Figure 1:
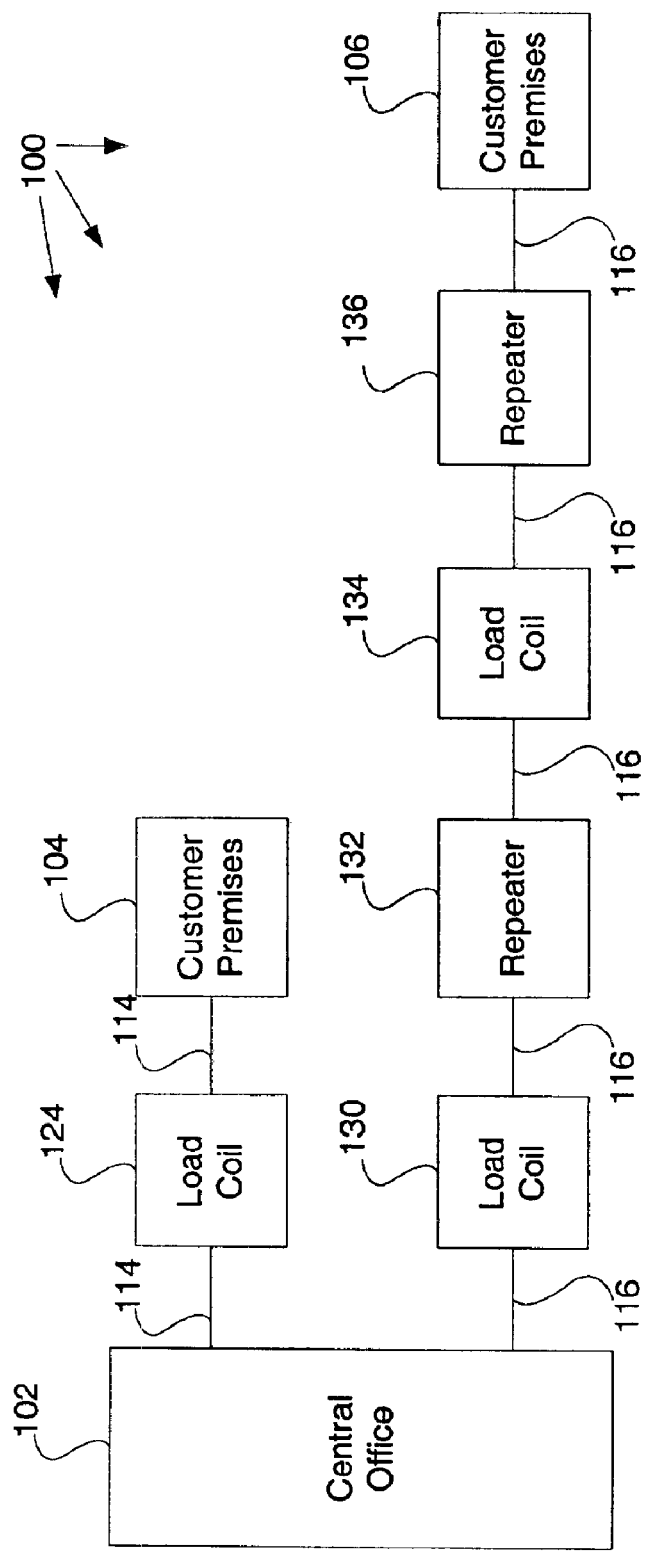
FIG. 1 illustrates a communication system for providing POTS and xDSL service over local loops.

FIG. 1 illustrates a communication system 100 that includes a central office 102, a customer premises 104 and a customer premises 106. The customer premises 104 and 106 are respectively coupled to the central office 102 by local loops 114 and 116. Each local loop comprises a twisted pair of copper wires; commonly know in the art as a "twisted pair." Typically, the copper wires are formed of 22, 24, or 26 AWG wire.

Moreover, as those skilled in the art will appreciate, the central office 102 and each of the customer premises 104 and 106 includes DSL termination equipment, such as a DSL modem or the like, for transmitting and receiving DSL signals over the associated local loop.

A load coil 124 is disposed along the local loop 114 between the central office 102 and the customer premises 104 to condition the loop for transmission of POTS-band signals and includes inductive elements, such as a coupled inductor, for compensating for, or counteracting, the distributed capacitance, or parallel capacitance of the local loop 114. The inductive elements flatten out the frequency response of the local loop for signals below about 3.6 KHz. Importantly, the load coil 124 also includes capacitive elements for significantly increasing the effective interwinding or intra-winding capacitance of the load coil to permit higher frequency signals associated with the provision of digital services, such as xDSL service, to traverse the load coil 124 with significantly less attenuation than with conventional load coils. Thus, both POTS-band and higher frequency signals may traverse the local loop 114 simultaneously, with the POTS-band signals being conditioned by the load coil 124 and the higher frequency signals, such as xDSL signals, passing across the load coil 124 with little, if any, attenuation.

A loop 116 is illustrated as having a load coil 130, a repeater 132, a load coil 134, and a repeater 136 disposed in cascaded fashion along the loop 116 to provide POTS and digital services over the loop 116 to the customer premises 106. Additional details of the load coil 130, which may be identical to the load coils 124 and 134 are described below with reference to FIGS. 3, 4, and 5. The DSL repeaters 132 and 136 are coupled to the local loop 116 to amplify digital signals, such as ADSL or VDSL signals, passing over the loop 116 between the central office 102 and the customer premises 106.

As those skilled in the art are generally aware, DSL signals are attenuated as they travel along a local loop, such as the local loop 116. The repeaters 132 and 136 are disposed along the loop 116 between the central office 102 and the customer premises 204 to at least partially compensate for the DSL signal attenuation by amplifying the transmitted DSL signals. Additional details of the repeaters 132 and 136, which may be configured identically, are described below with reference to FIG. 2.

Further, FIG. 1 illustrates that multiple DSL repeaters, such as the repeaters 132 and 136, may be coupled in series, or in cascaded fashion, to a single loop, such as the loop 116, for amplifying transmitted DSL signals multiple times and in multiple locations between the customer premises and the central office to permit DSL signals to be transmitted over greater distances while still maintaining an acceptable DSL signal amplitude.

According to one embodiment, the loop 116 comprises a loop length of about 20,250 feet of 24 AWG twisted pair cabling with a distance of about 2,250 feet between the central office 102 and the load coil 130. The loop distance between the load coil 130 and the repeater 132 is about 4,500 feet. The loop distance between the repeater 132 and the load coil 134 is about 4,500 feet. The loop distance between the load coil 134 and the repeater 136 is about 4,500 feet. The loop distance between the repeater 136 and the customer premises is about 4,500 feet. In this configuration, the repeaters 132 and 136 provide xDSL signal amplification and, preferably, some loop conditioning. The load coils 130 and 134 provide additional loop conditioning and permit passage of xDSL signals with little or no significant attenuation. Thus, according to one embodiment, the loop 116 may provide POTS and xDSL services over a loop having a length of 20,250 feet.

Those skilled in the art will appreciate that other separation loop distances may be employed. For example, in another embodiment using 26 AWG twisted pair cabling, the loop distance between the central office 102 and the load coil may be about 3,000 feet with the remaining repeaters and load coils being spaced apart by loop distances of 6,000 feet for a total loop length of about 27,000 feet.

Figure 2:
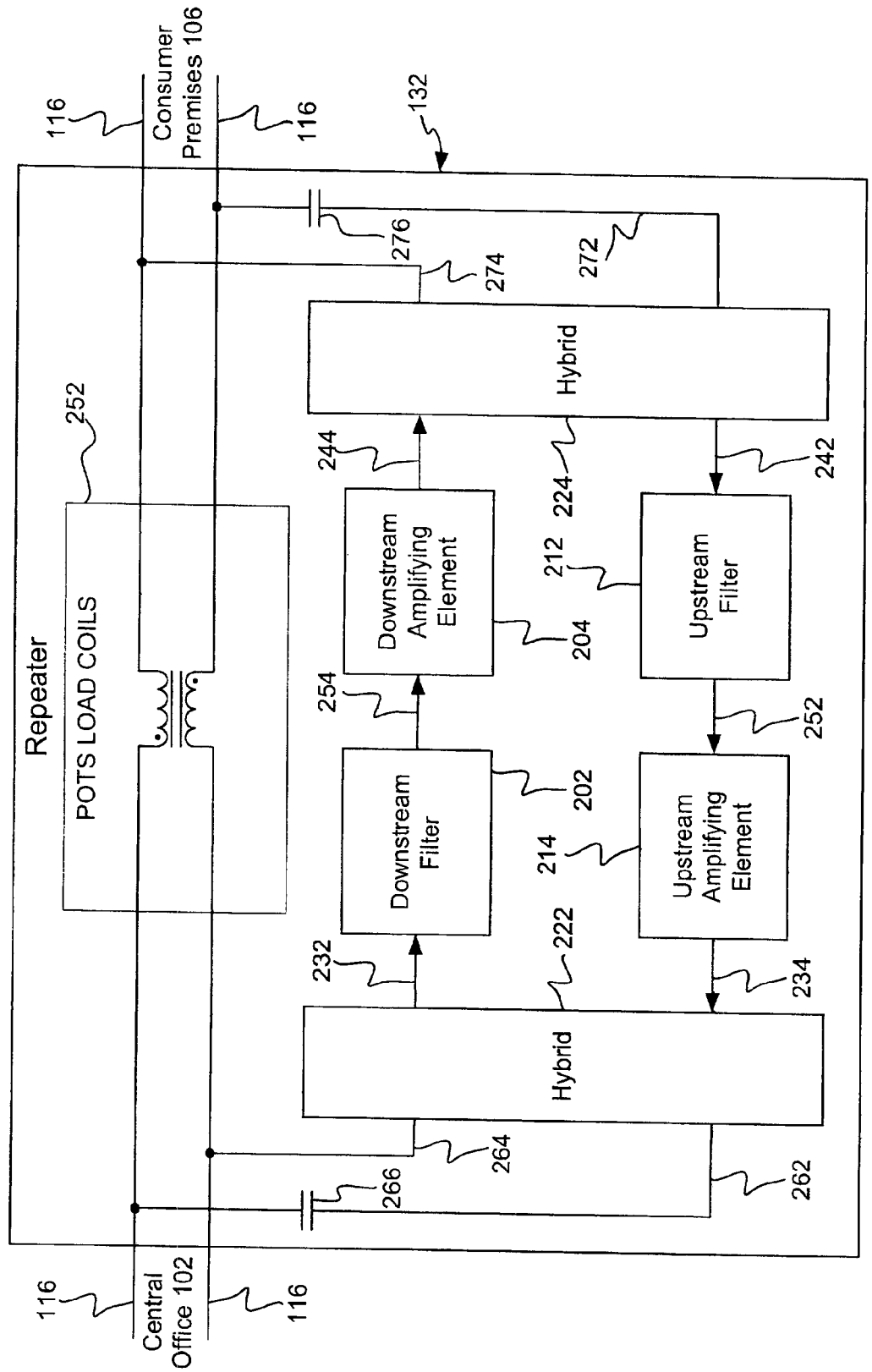
FIG. 2 illustrates details of one embodiment of a FIG. 1 repeater.

FIG. 2 illustrates details of one embodiment of the repeater 132 of FIG. 1. As shown, the repeater 132 is coupled to the local loop 116 between the central office 102 and the customer premises 106, and in particular is disposed between load coils 130 and 134 (FIG. 1). The repeater 132 is depicted as including a downstream filter 202 and a downstream amplifying element or stage 204 and an upstream filter 212 and an upstream amplifying element or stage 214. The filters 202 and 212 and the amplifying elements 204 and 214 are disposed between a pair of electromagnetic hybrid couplers 222 and 224. The amplifying elements 204 and 214 may comprise amplifiers or amplifying equalizers. Moreover, those skilled in the art will appreciate that the filter 202 and the amplifying element 204 may be embodied as a single circuit to filter and amplify downstream data signals. Similarly, the filter 212 and the amplifying element 214 may be embodied as a single circuit to filter and amplify upstream data signals.

In general, the hybrid coupler 222 receives downstream DSL signals from the central office 102 (FIG. 1) along the local loop 116 and outputs the downstream DSL signals to the downstream filter 202 along line 232. The hybrid coupler 222 also receives amplified upstream DSL signals from the upstream amplifying element 214 along line 234 and transmits the upstream DSL signals onto the local loop 116 for transmission to the central office 102.

Similarly, the hybrid coupler 224 receives upstream DSL signals from the customer premises 106 along the local loop 116 and outputs the upstream DSL signals to the upstream filter 212 along line 242. The hybrid coupler 224 also receives amplified downstream DSL signals from the downstream amplifying element 204 along line 244 and transmits the downstream DSL signals onto the local loop 116 for transmission to the customer premises 106.

As those skilled in the art will appreciate, where the hybrid coupler 222 is imperfect, at least a portion of the upstream amplified DSL signal received via the line 234 will leak through the hybrid coupler 222 onto the line 232. Likewise, where the hybrid coupler 224 is imperfect, at least a portion of the downstream amplified DSL signal received via the line 244 will leak through the hybrid coupler 224 onto the line 242. Without the presence of the filters 202 and 212, this DSL signal leakage could cause a phenomenon known in the art as "singing"—that is oscillations caused by introducing gain into a bi-directional system due to signal leakage.

The signal leakage problem is overcome, or substantially alleviated, through the use of the downstream filter 202 and the upstream filter 212. One version of Category 1 ADSL upstream signals generally occupy the frequency spectrum between about 26–120 KHz and ADSL downstream signals generally occupy the frequency spectrum between about 138 KHz–1.104 MHz. The downstream filter 202 substantially prevents leaked upstream signals from being transmitted back to the customer premises 106 by significantly attenuating signals between 26 KHz and 120 KHz for ADSL. Likewise, the upstream filter 212 is configured to provide significant attenuation to signals between about 138 KHz–1.104 MHz for ADSL. For other varieties of DSL, such as VDSL, the filters 202 and 212 respectively attenuate signals outside the downstream and upstream frequency bands, although the limits of these bands may be different than those for the ADSL variety.

The repeater 132 includes POTS loading coils 252 coupled to the loop 116 to improve transmission of voice, or POTS, frequency signals over long loop lengths, such as those longer than about 18,000 feet. In one embodiment, the POTS loading coils 252 comprise a coupled inductor having an inductance of about 88 mH.

The hybrid 222 is illustrated as being capacitively coupled to the local loop on the central office side of the POTS loading coils 252 along lines 262 and 264. A capacitor 266 (27–68 nF) is disposed along the line 262 to capacitively couple the hybrid 222 to the loop 116 on the central office side of the POTS loading coils.

Similarly, the hybrid 224 is illustrated as being capacitively coupled to the local loop 116 on the customer premises side of the POTS loading coils 252 along lines 272 and 274. A capacitor 276 (27–68 nF) is disposed along the line 272 to capacitively couple the hybrid 224 to the loop 116 on the customer premises side of the POTS loading coils.

Additional details of the repeater 132 are described in U.S. patent application Ser. No. 09/569,470 entitled "DSL Repeater" filed May 12, 2000 by Brian Hinman, Andrew Norrell and James Schley-May, and to U.S. patent application Ser. No. 09/670,475 entitled "Load Coil and DSL Repeater Including Same" filed on Sept. 26, 2000 by Brian Hinman, Andrew Norrell, Carl Alelyunas, and James Schley-May the disclosures of which are hereby incorporated by reference.

Figure 3:
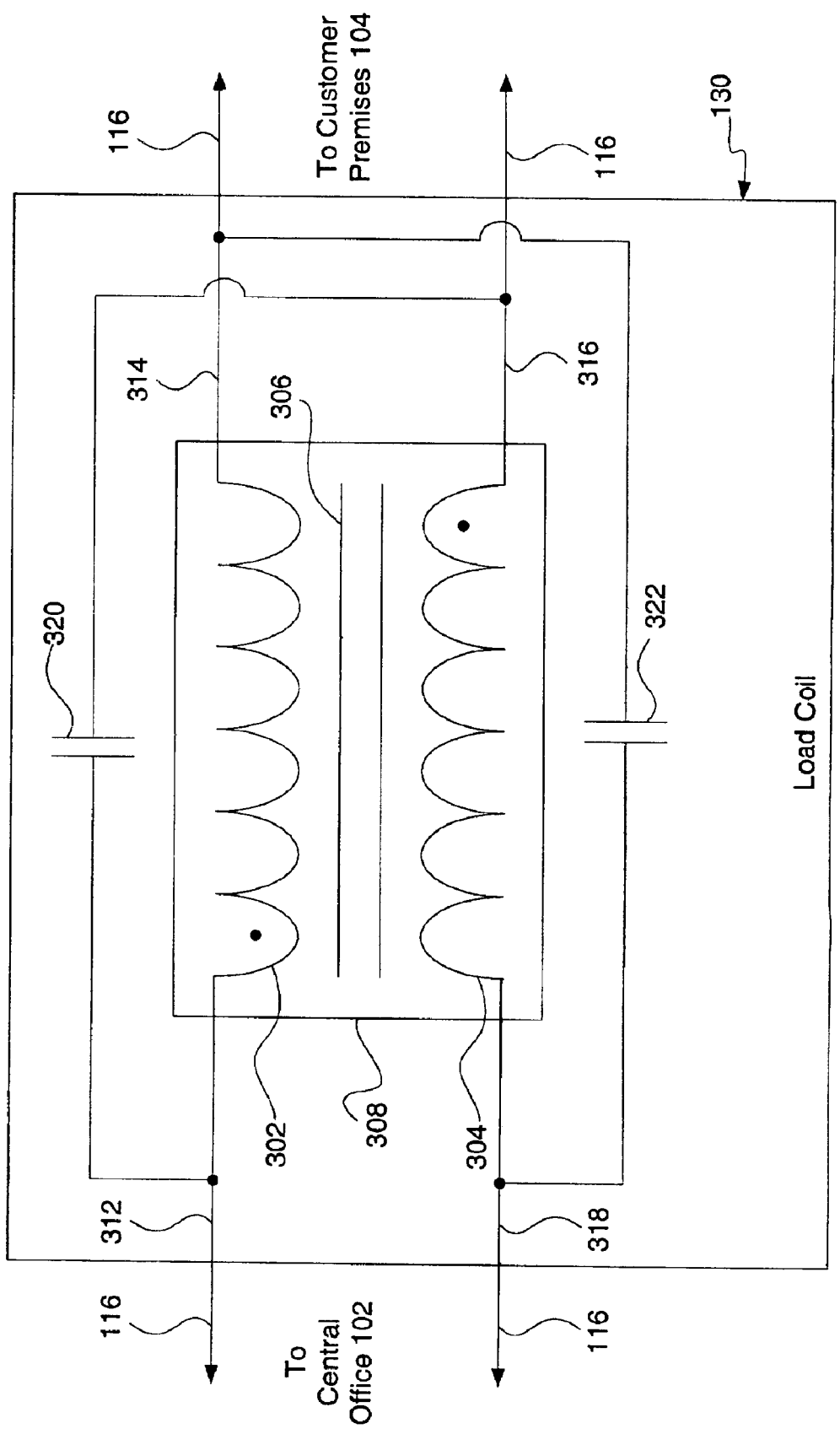
FIG. 3 illustrates details of one embodiment of a FIG. 1 load coil.

FIG. 3 illustrates one embodiment of the load coil 130 of FIG. 1. The load coils 124 and 134 may be configured identically to the load coil 130 and, therefore, only the load coil 130 will be described in detail, since the details described in connection with load coil 130 apply equally to the load coils 124 and 134.

The load coil 130 is shown as including inductor windings 302 and 304 wrapped about an inductor core to form a coupled inductor 308 disposed along the loop 116. In one embodiment, each winding has an inductance of about 33 mH to create a coupled inductor 308 having an inductance of about 66 mH. In another embodiment, the coupled inductor 308 comprises a pair of 44 mH windings to create a coupled inductor having an inductance of about 88 mH. As those skilled in the art will appreciate, the coupled inductor 308 is positioned along the loop 116 to compensate for, or counteract, the parallel, or distributed, capacitance of the loop 116 to improve POTS-band signals over the loop 116.

In particular, the coupled inductor 308 is shown as having a lead 312 coupled to the winding 302 input and a lead 314 coupled to the winding 302 output. Similarly, the input of the winding 304 has a lead 316 coupled thereto and the output of the winding 304 has a lead 318 coupled thereto.

The load coil 130 also includes capacitive elements, such as capacitors 320 and 322, to increase the effective inter-winding capacitance of the coupled inductor 308 for permitting higher frequency signals, such as xDSL signals, to traverse the load coil 130 with low attenuation. As shown, the capacitor 320 is disposed between the lead 312 of winding 302 and the lead 316 of the winding 304. The capacitor 322 is disposed between the lead 318 of the winding 304 and the lead 314 of the winding 302. In this configuration, the capacitors 320 and 322 increase the effective inter-winding capacitance of the coupled inductor 308.

In one embodiment, the capacitors 320 and 322 each have a capacitance of at least about five times, and preferably at least about 10 times the inter-winding capacitance of each of the windings 302 and 304. According to one implementation, the capacitors 320 and 322 each have a capacitance in the range of about 5–50 nF. In another implementation, the capacitors 320 and 322 each have a capacitance in the range of about 10–82 nF. In one application, capacitors 320 and 322 have a capacitance of about 39 nF. In another application, the capacitors 320 and 322 each have a capacitance of about 26 nF.

The presence of the capacitors 320 and 322 generally facilitate passage of higher frequency signals, such as signals in the ADSL band, from one end of the load coil to the other with much lower attenuation than without such capacitors, thereby permitting effective ADSL signal transmission over a loop loaded with the present load coil 130. As mentioned above, in the past, conventional load coils must be removed from a loop in order to provide digital services, such as ADSL service over the loop. The load coil 130, however, may be present in a local loop to condition the loop without preventing the provision of digital services, such as xDSL service, over the loop.

Figure 4:
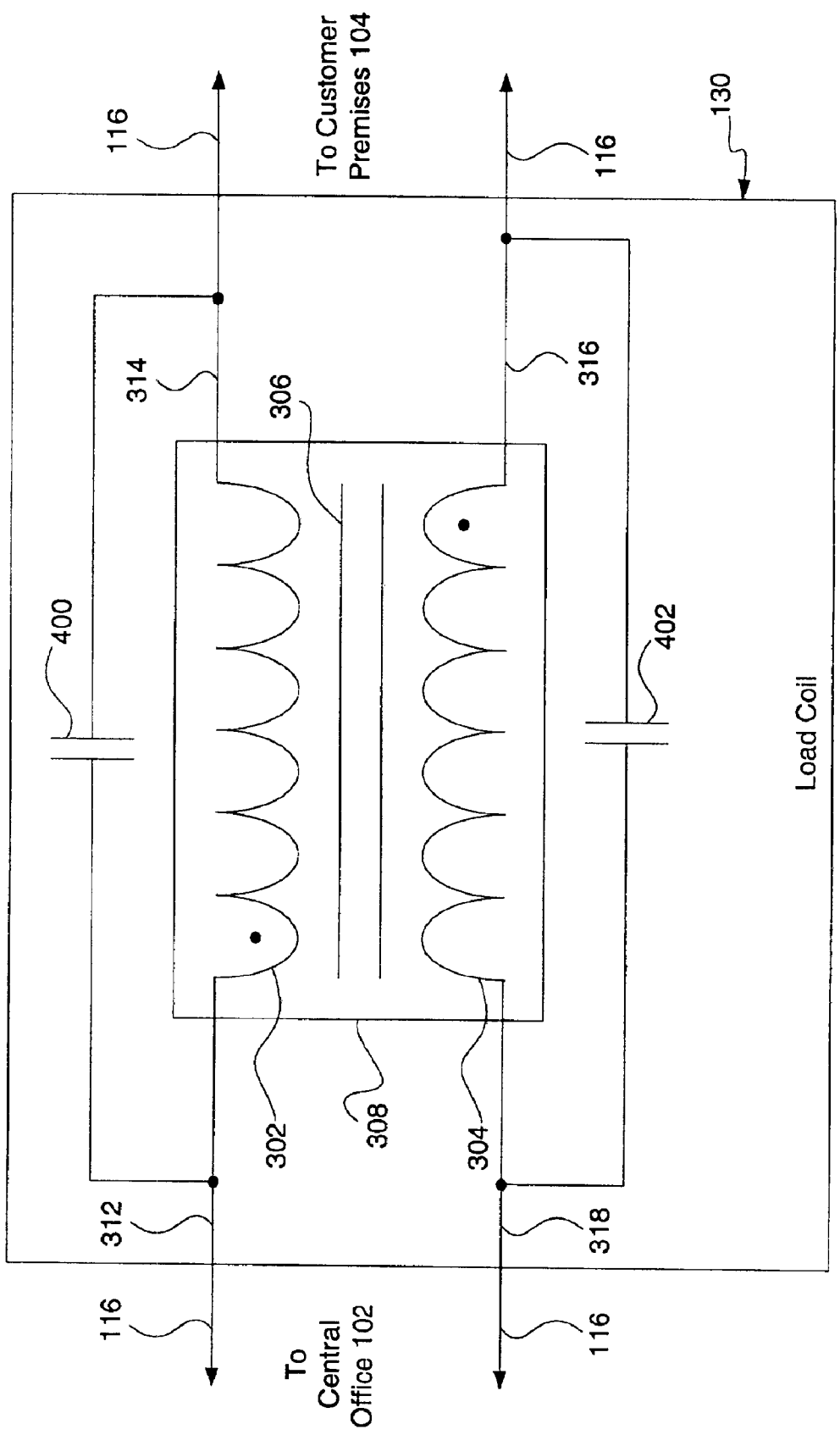
FIG. 4 illustrates details of another embodiment of a FIG. 1 load coil.

FIG. 4 illustrates another embodiment of the load coil 130. The load coil 130 of FIG. 4 is similar to the load coil 130 of FIG. 3, with the only difference being the configuration of the capacitive elements relative to the coupled inductor. As shown in FIG. 4, the load coil 130 includes capacitors 400 and 402 disposed in parallel with the windings 302 and 304 respectively. That is, the capacitor 400 is disposed between the leads 312 and 314 of the winding 302 and the capacitor 402 is disposed between the leads 316 and 318 of the winding 304. In this configuration, the capacitors 400 and 402 increase the effective intra-winding capacitance of the windings 302 and 304. Indeed, pursuant to one embodiment, the capacitors 400 and 402 each have a capacitance in the range of 100–1000 times the intra-winding capacitance of either of the windings 302 or 304.

Moreover, like the capacitors 320 and 322 of FIG. 3, the capacitors 400 and 402 may each have a capacitance in the range of about 5–50 nF. In another implementation, the capacitors 400 and 402 each have a capacitance in the range of about 10–82 nF. In one application, capacitors 400 and 402 each have a capacitance of about 39 nF. In another application, the capacitors 400 and 402 each have a capacitance of about 26 nF.

The load coil 130 of FIG. 4 has considerable utility in that, like the load coil 130 of FIG. 3, the FIG. 4 load coil conditions the local loop for POTS service while permitting digital services to be provided over the same loop. However, in one application, use of the FIG. 4 embodiment may cause some degradation of POTS service. The load coil of FIG. 3, therefore, may be preferable to the load coil of FIG. 4 in some applications.

Figure 5:
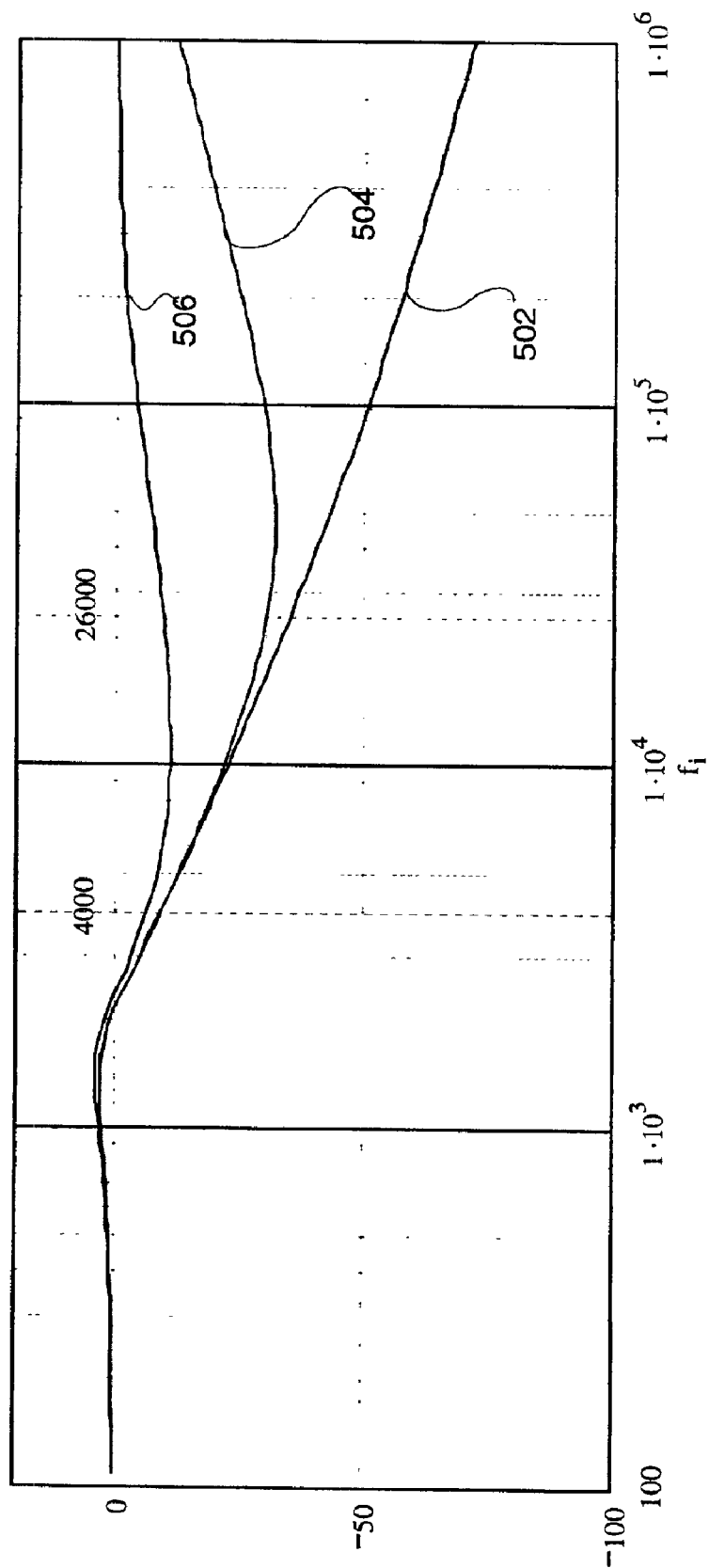
FIG. 5 is a graph illustrating the frequency responses of different load coils.

FIG. 5 is a graph comparing the transfer function, or frequency response, of a pure, or ideal, 66 mH load coil (plot 502), a real world 66 mH load coil having some inter-winding capacitance and some intra-winding capacitance (plot 504), and the load coil 130 of FIG. 3 with the capacitors 320 and 322 having a capacitance of about 27 nF and the coupled inductor having a 66 mH inductance (plot 506).

As shown, the plot 502 shows a great deal of high frequency signal attenuation in the ADSL band (about 26 KHz–1.1 MHz). Indeed, the ideal load coil is shown as imparting about 50 dB of attenuation to 100 KHz signals.

Plot 504 illustrates that one embodiment of a real world load coil also imparts a great deal of high frequency signal attenuation to signals in the ADSL band. As shown, one embodiment of a common conventional load coil imparts over 25 dB of attenuation to ADSL signals between about 26–110 KHz.

In contrast, as shown by plot 506, the load coil 130 of FIG. 3 imparts significantly less attenuation to signals in the ADSL band, while still conditioning the POTS band. As shown, the load coil 130 of FIG. 3 imparts less than about 12 dB of attenuation to signals in the lower ADSL band. Further, the load coil 130 of FIG. 3 imparts no significant attenuation to 1 MHz ADSL signals. Thus, by employing the load coil 130 as described above, a local loop may be conditioned for POTS service while still permitting digital services to be transmitted over the same loop.

The invention has been described above with reference to specific embodiments. It will, however, be evident that various modifications and changes may be made thereto without departing from the broader spirit and scope of the invention. The foregoing description and drawings are, accordingly, to be regarded in an illustrative rather than a restrictive sense.

What is claimed is:

1. A system for transmitting DSL and POTS signals over a local loop, the system comprising:
   a first load coil for disposal along the local loop to condition the POTS signals, the first load coil including a coupled inductor and multiple capacitive elements for increasing an effective capacitance of the coupled inductor, wherein the multiple capacitive elements have capacitance values relative to an interwinding capacitance value of the coupled inductor to improve transmission of DSL signals across the first load coil;
   a first DSL signal repeater for disposal along the local loop in series with the first load coil to amplify the DSL signals, the first DSL signal repeater including a second load coil for conditioning POTS signals passing there through, wherein the coupled inductor has first and second windings wrapped about an inductor core, each winding havin an input and an output the multiple capacitive elements further comprising
   a first capacitive element being disposed between the input of the first winding and the input of the second winding; and
   a second capacitive element disposed between the output of the first winding and the output of the second winding.

2. The system for transmitting DSL and POTS signals according to claim 1, wherein each capacitive element has a capacitance value between 10 nF–82 nF.

3. The system for transmitting DSL and POTS signals according to claim 1, wherein each capacitive element has a capacitance value between 5 nF–50 nF.

4. A method for improving simultaneous transmission of POTS-band signals and DSL signals across a local loop, comprising:
   inductively coupling a first segment of the local loop to a second segment of the local loop via a coupled inductor to condition the POTS-band signals traversing the local loop;
   capacitively coupling the first segment of the local loop to the second segment of the local loop via capacitive elements to pass the DSL signals traversing the local loop with low attenuation, the capacitive elements having capacitance values that are selected based upon a capacitance value of the coupled inductor; and
   amplifying the DSL signals between the first segment of the local loop and a third segment of the local loop but after the coupled inductor and the capacitive elements.

5. The method of claim 4, wherein the step of inductively coupling includes coupling a first wire of the first segment of the local loop to a first wire of the second segment of the local loop via a first inductor winding wrapped about an inductor core, and coupling a second wire of the first segment of the local loop to a second wire of the second segment of the local loop via a second inductor winding wrapped about the inductor core.

6. The method of claim 5, wherein the step of capacitively coupling includes coupling a first wire of the first segment of the local loop to a second wire of the second segment of the local loop via a first capacitive element, and coupling a second wire of the first segment of the local loop to a first wire of the second segment of the local loop via a second capacitive element.

7. The method of claim 4, wherein the step of capacitively coupling includes coupling a first wire of the first segment of the local loop to a first wire of the second segment of the local loop via a first capacitive element, and coupling a second wire of the first segment of the local loop to a second wire of the second segment of the local loop via a second capacitive element.

8. A system to improve simultaneous transmission of POTS-band signals and DSL signals across a local loop, the system comprising:
   a first local loop, the first local loop including
      a first wire, and
      a second wire;
   a second local loop, the second local loop including
      a third wire, and
      a fourth wire;
   a coupled inductor configured to condition the POTS-band signals traversing the first and second local loops, the coupled inductor including
      an inductor core,
      a first inductor winding wrapped about the inductor core and coupling the first wire to the third wire, and
      a second inductor winding wrapped about the inductor core and coupling the second wire to the fourth wire; and
   capacitive elements configured to pass the DSL signals traversing the first and second local loops, the capacitive elements including
      a first capacitor coupling the first wire to the fourth wire, and
      a second capacitor coupling the second wire to the third wire, wherein the first capacitor and the second capacitor have capacitance values that are at least four times an inter-winding capacitance value between the first inductor winding and the second inductor winding.

9. A system to improve simultaneous transmission of POTS-band signals and DSL signals across a local loop, the system comprising:
   a first local loop, the first local loop including
      a first wire, and
      a second wire;

a second local loop, the second local loop including
    a third wire, and
    a fourth wire;
a coupled inductor configured to condition the POTS-band signals traversing the first and second local loops, the coupled inductor including
    an inductor core,
    a first inductor winding wrapped about the inductor core and coupling the first wire to the third wire, and
    a second inductor winding wrapped about the inductor core and coupling the second wire to the fourth wire; and
capacitive elements configured to pass the DSL signals traversing the first and second local loops, the capacitive elements including
    a first capacitor coupling the first wire to the fourth wire, and
a second capacitor coupling the second wire to the third wire, wherein the first capacitive element to electrically connects in parallel with the inter-winding capacitance between the first inductor winding and the second inductor winding.

10. The system of claim 9, wherein the first and second capacitors each have a capacitance value at least five times the inter-winding capacitance value between the first inductor winding and the second inductor winding.

11. A method, comprising:
passing a first type of signal having a frequency greater than twenty kilohertz of across a coupled load coil that has a first winding, a second winding and a capacitive element disposed in parallel with an inter-winding capacitance between the first winding and the second winding; and
passing a second type of signal in a voice frequency range across the load coil at the same time as the first type of signal pass through the load coil regardless of whether the second type of signal was transmitted in the same direction in relation to the load coil as the first signal, wherein the capacitive element has a capacitance value that is at least four times the inter-winding capacitance value between the first winding and the second winding to permit passage of the first type of signal across the load coil at the same time as the second type of signal.

12. An apparatus, comprising:
means for passing a first type of signal having a frequency greater than twenty kilohertz of across a coupled load coil that has a first winding, a second winding and a capacitive element disposed in parallel with an inter-winding capacitance between the first winding and the second winding; and
means for passing a second type of signal in a voice frequency range across the load coil at the same time as the first type of signal pass through the load coil regardless of whether the second type of signal was transmitted in the same direction in relation to the load coil as the first signal, wherein the capacitive element has a capacitance value that is at least four times the inter-winding capacitance value between the first winding and the second winding to permit passage of the first type of signal across the load coil at the same time as the second type of signal.

* * * * *

UNITED STATES PATENT AND TRADEMARK OFFICE
CERTIFICATE OF CORRECTION

PATENT NO. : 6,947,529 B2 Page 1 of 1
APPLICATION NO. : 09/819158
DATED : September 20, 2005
INVENTOR(S) : Andrew L. Norrell and James Schley-May It is certified that error appears in the above-identified patent and that said Letters Patent is hereby corrected as shown below:

Col. 7

Claim 1, line 46, delete "havin" and insert --having--.

Claim 1, line 46, delete "output" and insert --output,--.

Signed and Sealed this

Fifth Day of October, 2010

David J. Kappos
*Director of the United States Patent and Trademark Office*